United States Patent [19]

Vokoun, III

[11] Patent Number: 5,096,855
[45] Date of Patent: Mar. 17, 1992

[54] METHOD OF DICING SEMICONDUCTOR WAFERS WHICH PRODUCES SHARDS LESS THAN 10 MICRONS IN SIZE

[75] Inventor: Edward R. Vokoun, III, Tijeras, N. Mex.

[73] Assignee: U.S. Philips Corporation, New York, N.Y.

[21] Appl. No.: 630,719

[22] Filed: Dec. 20, 1990

Related U.S. Application Data

[62] Division of Ser. No. 197,544, May 23, 1988, Pat. No. 5,003,374.

[51] Int. Cl.⁵ .............................................. H01L 21/78
[52] U.S. Cl. ........................................ 437/227; 83/30; 83/41; 148/DIG. 28; 437/226
[58] Field of Search .................... 437/226, 227; 83/30, 83/41; 156/634, 645; 148/DIG. 28; 357/52, 53, 68, 85

[56] References Cited

U.S. PATENT DOCUMENTS 4,503,597  3/1985  Kushima et al. .................. 29/569 R
4,835,592  5/1989  Zommer .............................. 357/68

FOREIGN PATENT DOCUMENTS 56-43740  4/1981  Japan .
60-63921  4/1985  Japan .
0263742  10/1988  Japan .................................. 437/226
0030117  1/1990  Japan .................................. 437/226
0230162  1/1990  Japan .

Primary Examiner—Olik Chaudhuri
Assistant Examiner—Ken Horton
Attorney, Agent, or Firm—Ernestine C. Bartlett

[57] ABSTRACT

A method (and semiconductor devices and wafers producers therefrom) is provided which method comprises providing a semiconductor wafer which comprises at least two physically interconnected semiconductor devices including at least one scribe lane formed at a peripheral edge between the semiconductor devices; covering at least a portion of the scribe lane with a continuous metal film, forming metal limiting means in the metal film of predetermined configuration and spacing so that no space between the metal limiting means exceeds 10 microns in any direction; and thereafter scribing the semiconductor wafer to produce a device containing bent metal portions within the range of 0 to 10 microns.

18 Claims, 4 Drawing Sheets

SCRIBE LINE PATTERN

METHOD OF DICING SEMICONDUCTOR WAFERS WHICH PRODUCES SHARDS LESS THAN 10 MICRONS IN SIZE

FIELD OF THE INVENTION

This invention relates to semiconductor devices such as transistors, diodes, planar integrated circuits and the like.

BACKGROUND OF THE INVENTION

In the manufacture of semiconductor devices, a plurality of integrated circuits are simultaneously prepared in a semiconductor wafer through the use of conventional photolithographic techniques. Thus, for example, a wafer may contain up to 1000 or more separaate integrated circuit which have been formed on the substantially planar surface area of the wafer according to conventional techniques in the art as, for example, by diffusing or otherwise forming predetermined patterns in a silicon body. It is also convenient to provide a plurality of secondary devices such as contact pads, test monitor devices, devices for measurement and alignment, etc. on the planar surface adjacent the outer perimeter of each integrated circuit or other semiconductor device. Each single integrated circuit is of relatively minute dimensions so that it is convenient to simultaneously form a plurality in a single wafer while marking the boundaries between the individual devices by scoring along perpendicular axes referred to as scribe lanes or streets.

In accordance with techniques well known in the art, after a semiconductor wafer has been formed into interconnected semiconductor devices. The chips are tested to identify those which contain properly functioning properties and are satisfactory and those improperly formed or malfunctioning and unsatisfactory. As mentioned earlier, it is common practice to put test, measurement, alignment and die seal structures in the scribing lanes. After testing, adjacent satisfactory chips are left joined together while unsatisfactory chips are separated or the entire wafer is separated and the unsatisfactory chips are discarded. Separation (or dicing) may be performed by conventional techniques such as sawing or laser cutting along the scribe lane.

The scribing step itself, while relatively simple, is not free of problems. For example, the wafer contains a substantial amount of metallization in the area of the scribe lanes which, when sawed or separated often leaves relatively large jagged pieces of metal commonly referred to as shards or slivers that remain attached to the edge or edges of the semiconductor device. Such shards of metal often turn or bend over the scribe lane or break off interfering with the intended properties of the devices, for example by contacting bonding wire or other wires in the device. Such contact often results in an unsatisfactory, malfunctioning device that must be discarded resulting in a lowered yield of semiconductor devices from the manufacturing process.

One of the greatest problems of large scale integration of, for example, electronic circuits, is that of obtaining a high enough yield on each wafer of circuits to be commercially profitable. As the number of devices per circuit increases, the yield often decreases proportionally. It is therefore highly desirable to minimize the number of devices that must be discarded as unsatisfactory. Moreover, because the scribing process may itself produce unsatisfactory devices, improvements in this step are of increasing importance.

In Japanese Patent Application Publication (Kokai) No. 56-43,740, there is described a method for providing a semiconductor wafer with metal coating in the scribing area which can be scribed with a reduced risk of bending of the metal film by providing at the scribe lane a metal coating having a strip-like configuration and a row of slits arranged along the center lines of the metal film and oriented perpendicularly to the center lines. According to the Kokai, it is possible to protect the wafer from deterioration of properties by the use of such slits in the scribe areas since, if portions of metal film are bent during the scribing operation, the dimensions of the bent portions are limited to the spaces between adjacent slits with the maximum length being equal to the length of the slits so that in case of bending, the bent portion cannot come into contact with bonding wires or pattern elements.

Such a construction, while fine for certain applications, would not qualify the semiconductor devices produced for certain other applications, such as, for example certain applications which require that the device conform to military standards, wherein the dimensions of any metal or metal shards present on the device must meet certain minimum size standards. For example, certain U.S. government specifications require that in such devices, metal shards or turnover may not exceed 0.4 mil (10 microns) in any given dimension. The devices of the Japanese Kokai, however, produce shards that are generally 2 to 5 mils (50 to 200 microns) rendering such devices unusable for such applications and rejectable as unsatisfactory.

Additionally, in the device described in the Japanese Kokai, great precision in performing the sawing or separation is required and there is little tolerance for variation in the scribe operation. Moreover, as illustrated in the drawing of the publication, metal shard formation appears to be of concern only in the corners of the devices, the slits appearing to be present in the corners only.

An object of this invention is the provision of a simple method for increasing the yield of satisfactory semiconductor devices in semiconductor wafers.

Another object of the invention is the provision of a semiconductor wafer which may be variably and flexibly scribed and tested.

Another object of the invention is the provision of a semiconductor device comprising a metal film which may be scribed along multiple scribe lanes without producing metal shards or bent portions that exceed 0.4 mils (or 10 microns) in any dimension.

Another object of the invention is to provide a method of scribing semiconductor wafers in which the dimensions of metal shards or bends resulting from the scribing are controllable, predetermined and predesigned.

There and other objects of the invention will be apparent from the description of the invention which follows.

SUMMARY OF THE INVENTION

In accordance with this invention, a semiconductor wafer is provided which comprises at least two interconnected semiconductor devices or dice including at least one scribe lane formed at a peripheral edge of the semiconductor devices and preferably a plurality of scribe lanes formed at each peripheral edge of each semiconductor device; a metal film convering at least a portion of said scribe lane and having metal limiting means, preferably a plurality of perforations, formed therein, said metal limiting means being preselectively spaced and configured whereby scribing the wafer in any direction along a scribe lane and beginning at any point on said lane will result in a metal shard or turnover within the range of 0 to less than 10 microns and preferably less than about 7 microns in any dimension, i.e. width or length and/or in any direction.

The metal limiting means may take the form of patterning holes, slots, slits, rectangles squares, crosses, etc. and combinations thereof and may be formed by means conventional in the art such as for example by chemical etching, plasma etching, ion milling, etc. Such metal limiting means may take any shape desired and may be as large or as small as may be desired and still function in the invention as long as the distance between adjacent means in any direction is not greater than about 7 to 10 microns.

DETAILED DESCRIPTION OF PREFERRED EMBODIMENTS

Figure 4:
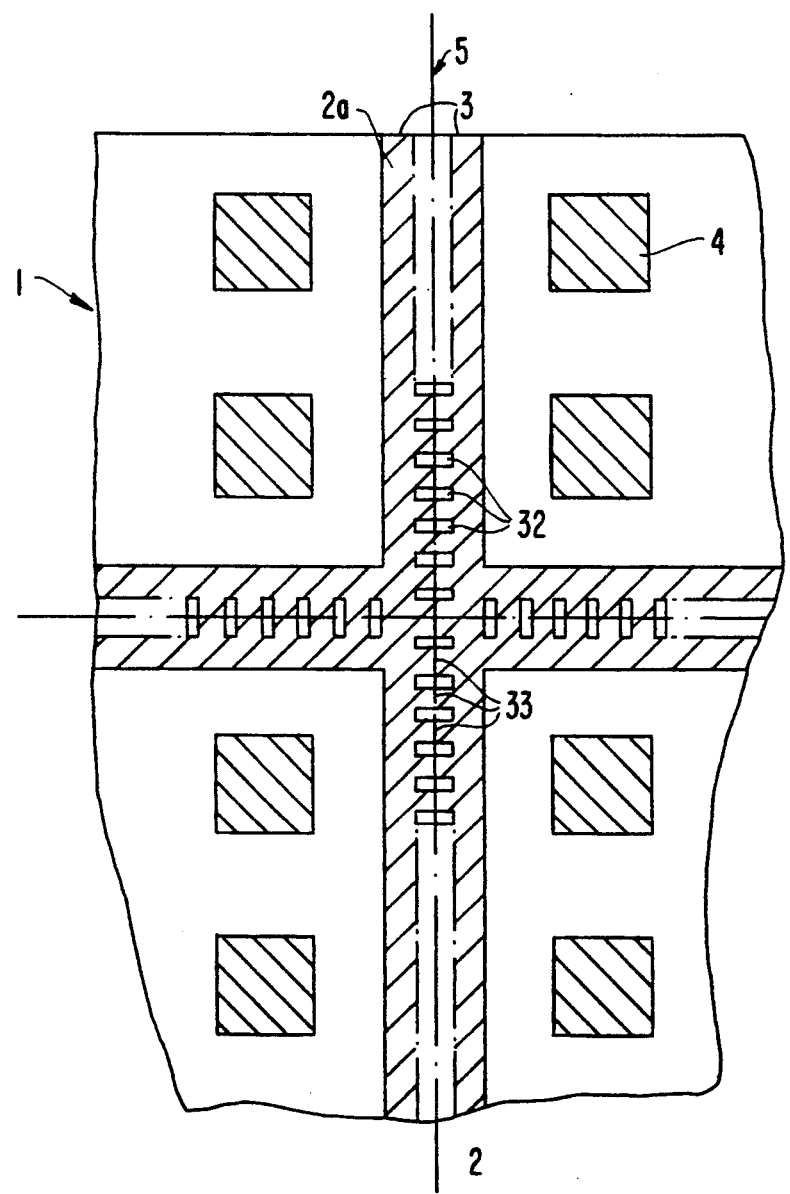
FIG. 4 is a plan view of a portion of a wafer containing a plurality of prior art interconnected semiconductor devices illustrating the scribe area.

For comparison, there is illustrated in FIG. 4, the device of the Japanese Kokai discussed hereinabove showing portion of a semiconductor wafer 1 with a metal film coating 2 which has a width of 150 microns and includes a 50 micron wide scribe area 3. Reference numeral 4 designates bonding pads of respective dice or chips and the coating 2 has a strip-like configuration which consists of continuous metal and film portions 2a and with a row of slits 32 arranged along the center line 5 of the coating. Each slit is perpendicular to the center line 5 and has a width of 10 microns. The dimensions of bent portions of metal are disclosed to be limited to the space 33 between adjacent slits which is not further defined and the maximum length of bent portions of metal is said to be equal to the length of the slits which also is not further defined. In actuality, such devices produce metal shards that far exceed the maximum limits tolerated by the present invention and are not suitable for use in applications where more stringent lower limits on metal shard dimensions are imposed. In the Kokai, the voids are located only along the center lines of the scribe lanes. In contrast, the voids formed in this invention are preferably dispersed across substantially the entire area of the metal in the scribe lanes or across the entire area of the secondary device or devices in the scribe lanes or in only a portion of any area of the scribe lane or secondary device. In any event, the distribution of the voids is substantially uniform and may be predetermined in the design of a suitable mask and/or photoresist or other imaging devices wherein patterns and/or predetermined configurations may be formed on a substrate by methods that are well known in the art.

Figure 1:
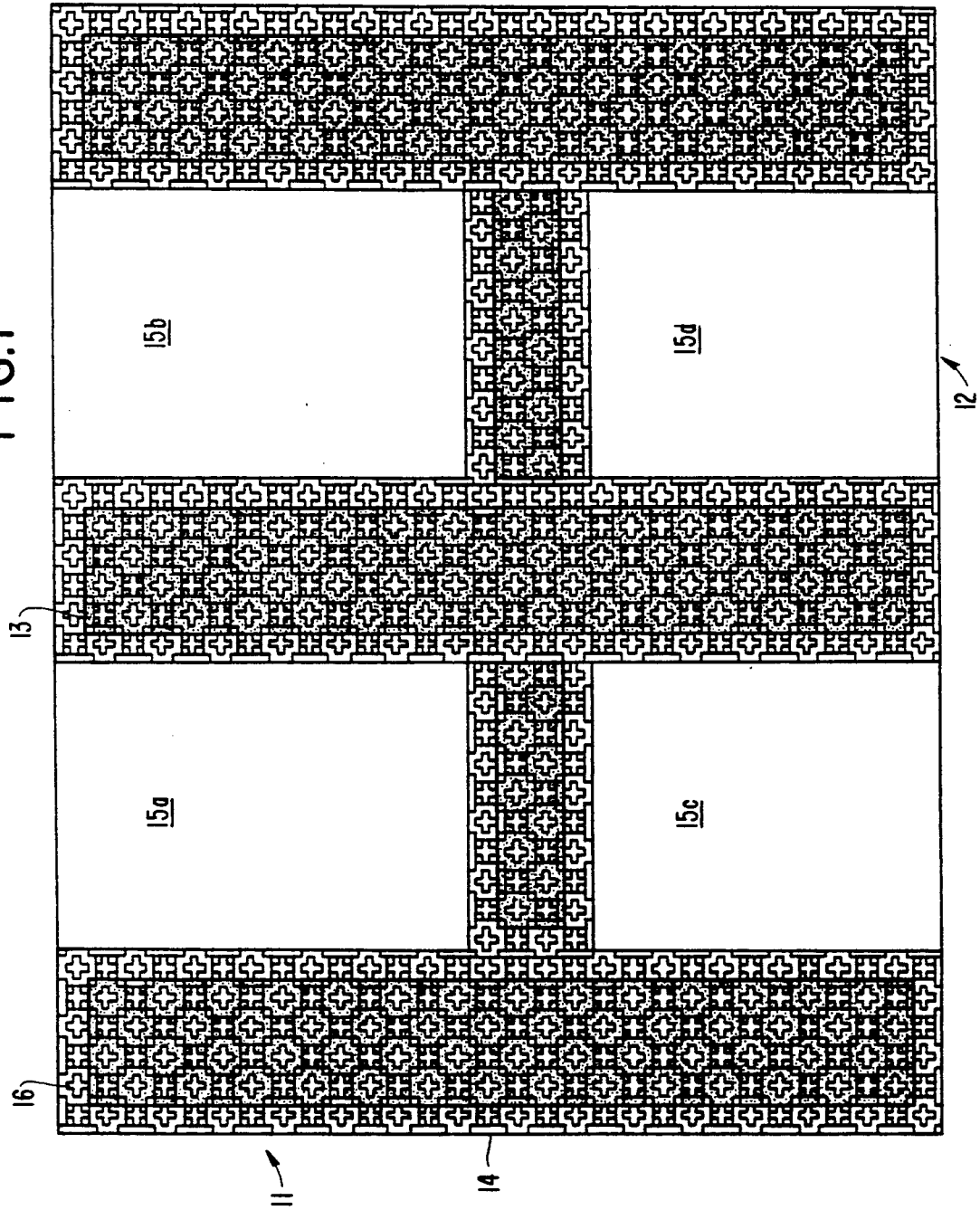
FIG. 1 is a plan view of a portion of a wafer containing a plurality of interconnected semiconductor devices of the invention illustrating the metal limiting means of this invention.
Figure 2:
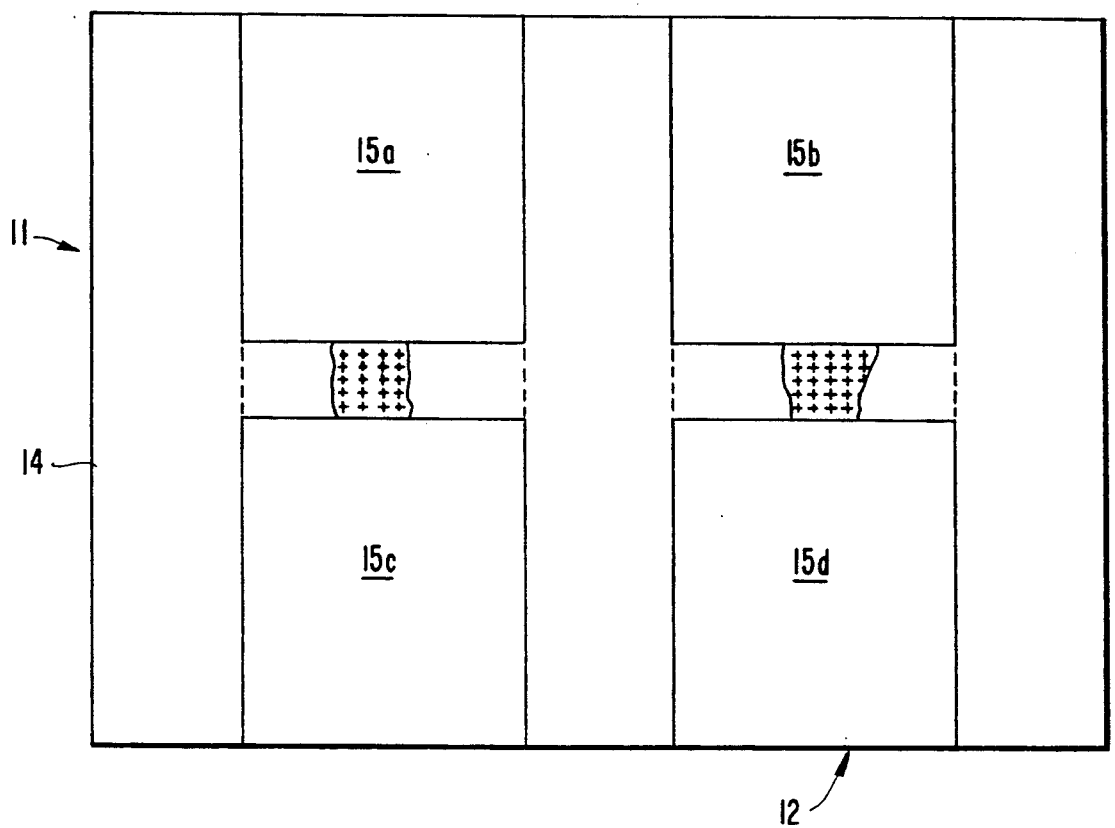
FIG. 2 is a top plan view of a portion of a wafer containing a plurality of semiconductor devices of the invention illustrating an alternative arrangement of the metal limiting means of the invention.
Figure 2A:
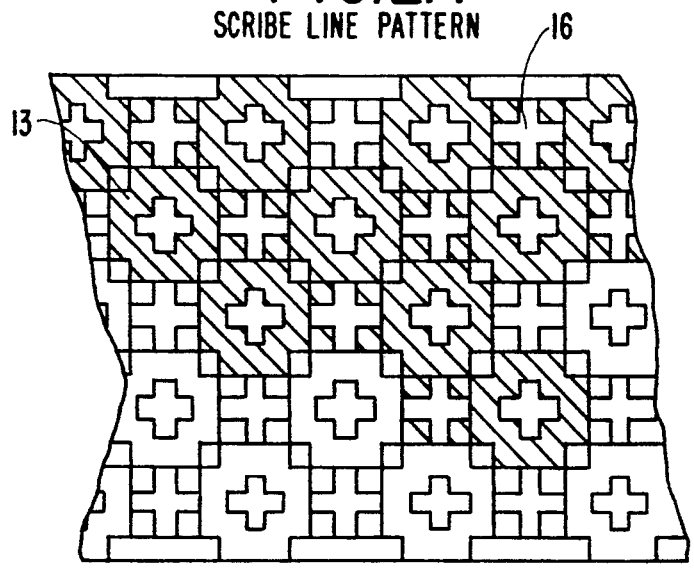
FIG. 2A is a magnified plan view of a portion of a metal limiting means of the invention.
Figure 3:
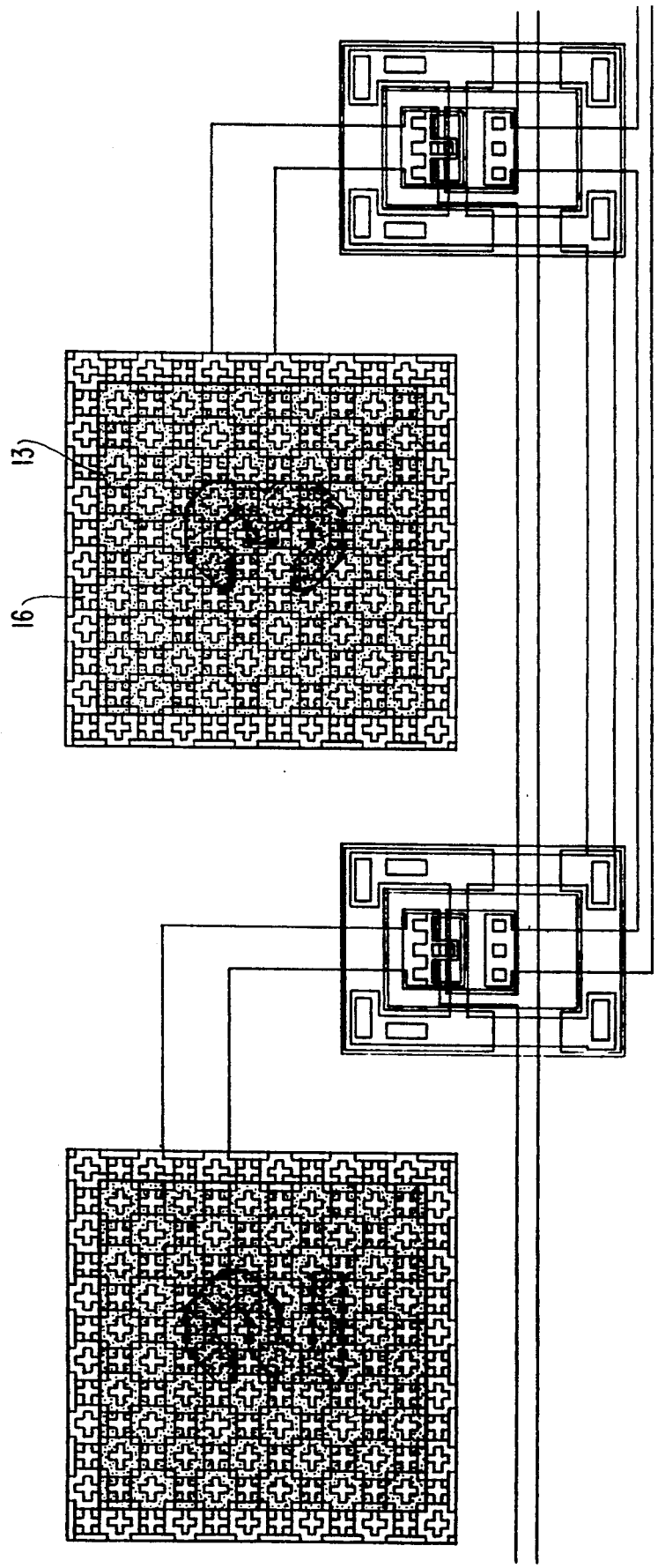
FIG. 3 is a plan view of a portion of a process control monitor containing the metal limiting means of the invention.

With reference to FIG. 1, there is illustrated a portion of a semiconductor wafer 11 produced according to the invention. Component parts which are not essential to an understanding of the invention are not shown for the sake of clarity. Semiconductor wafer 11 has a surface 12 (which although not illustrated as such is preferably planar), a metal coating 13 with perpendicular scribing lanes 14 formed therein defining and/or delineating several semiconductor devices 15a, 15b, 15c, 15d formed in the planar surface of the wafer. Scribing lanes 14 are coated with a metal film (which is preferably aluminum) patterned with a plurality of voids 16 which are areas devoid of metal film and may be of any shape desired, e.g. crosses and squares, irregularly shaped or round holes, elliptical slots or slits, rectangles, triangles and combinations thereof. Optionally, the scribe lanes may also contain process test monitors or other secondary devices for alignment, testing, measurement, and/or sealing, etc. of the semiconductor device. In such an event, the secondary devices will have the same metal coating and patterned voids as described hereinabove and may comprise all or a portion of said scribe lanes. For example, typically a scribing lane of the invention may be 200 microns in width and contain a process control monitor approximately 100 microns wide, the semiconductor device or chip being approximately 1000 microns wide and the saw cut being approximately 40 microns wide. The voids 16 however configured typically vary from 25 to 50 microns in width, depending on the size of the chip and are arranged so that the spaces 17 between them are no greater than a distance of about 7 to 10 microns in any direction. Thus, a illustrated in FIG. 1, to separate the devices 15a, 15b, 15c, and 15d, a saw cut of about 40 microns or greater may be created at any point in the scribe lane 14 which is itself typically about 200 microns in width when a secondary device such as a bonding pad, scribe process control monitor, etc. is included within its boundaries and about 100 microns in which when such secondary devices are not incorporated. Upon effecting the saw cut and separation, because of the spacing between the various metal limiting means or voids 16, substantially all metal coating that is severed or bent during the scribing step will have a maximum size of 7 to 10 microns in any given dimension. This represents a dimension that is unlikely to interfere with or disrupt the function of the devices whereby the yield of semiconductor devices may be substantially increased.

It will be seen that what has been described in an improve semiconductor wafer produced by an improved method for improving the yield of semiconductor devices therefrom.

While the invention has been described with reference to the scribe lanes and particularly those that have been coated will metal, the invention is useful in any area of a semiconductor wafer surface where shards of material or bent portions of material may present a problem. Thus, the material is not necessarily limited to metal film coatings and could be a synthetic resin or a suitable plastic material. Additionally, while the devices have been illustrated as being a certain maximum size, it will be understood that even smaller dimensions may be utilized, the lower limit being determined only by the ability to process the resulting devices.

Additionally, while the invention has been described in terms of the scribe lanes, it will also be understood that the metal limiting means may comprise only a portion of the scribe area or may be incorporated selectively into components of the semiconductor wafer or device such as bonding pads, scribe process control monitors, alignment and measuring devices, etc., without otherwise being incorporated into the entire scribe lane structure. In either embodiment, the voids are distributed in substantially uniform and predetermined manner throughout the portion of the scribe area where it is desired to control the size of metal shards.

I claim:

1. A method for separating physically interconnected semiconductor devices from a semiconductor wafer comprising a plurality of such devices comprising the steps of:
providing a semiconductor wafer which comprises at least two physically interconnected semiconductor devices including at least one scribe lane formed at a peripheral edge between the semiconductor devices;
covering at least a portion of said scribe lane with a continuous metal film;
forming voids in said metal film of such configuratioin and spacing that no space between said voids exceeds about 7 to 10 microns in any direction;
scribing the semiconductor wafer in any direction along said scribe lane to separate said devices; and
recovering a separated semiconductor device wherein substantially no metal shards or bent metal portions formed during said scribing and separation step exceed about 7 to 10 microns in any dimension.

2. A method as claimed in claim 1 in which the voids are in the shape of squares, rectangles, holes, slits, crosses triangles and combinations thereof.

3. A method as claimed in claim 2 in which the voids are so arranged that no space between them exceeds about 10 microns in any direction.

4. A method as claimed in claim 3 wherein the scribe lanes include a process control monitor, alignment, testing or other processing device, said devices also containing the said voids.

5. A method for the manufacture of semiconductor devices which comprises the steps of:
providing a semiconductor product which comprises at least two physically interconnected semiconductor devices having at least one scribe lane area formed in at least a peripheral edge thereof;
covering at least a portion of said scribe lane area with a metal film;
forming metal limiting means in said metal film;
scribing the semiconductor device in any direction along said scribe lane area to separate said devices; and
recovering a separated semiconductor device wherein metal shards resulting from said scribing are within the range of 0 to 10 microns.

6. A method as claimed in claim 5 in which the metal limiting means are a plurality of voids in the shape of squares, rectangles, holes, slits, crosses, triangles and combinations thereof.

7. A method as claimed in claim 6 wherein the voids are so arranged that no space between adjacent semiconductor devices is greater than 10 microns.

8. A method as claimed in claim 5 wherein the metal shard is 7 microns or less.

9. A method as claimed in claim 7 wherein the voids are spaced about 10 microns or less in all directions.

10. A method as claimed in claim 5 wherein the scribe lane contains a device selected from a process control monitor, alignment, testing, and other processing device, said device also containing said metal limiting means.

11. A method as claimed in claim 6 wherein the distribution of said voids is substantially uniform.

12. A method as claimed in claim 11 wherein voids are distributed throughout the entire area of the device contained in the scribe lane.

13. A method as claimed in claim 6 wherein voids are distributed throughout the entire area of the metal in the scribe lane.

14. A method as claimed in claim 7 wherein the distribution of said voids is uniform.

15. A method as claimed in claim 10 wherein the metal limiting means are voids distributed throughout the entire area of the device contained in the scribe lane.

16. A method as claimed in claim 15 wherein the distribution of said voids is uniform.

17. A method for the manufacture of semiconductor devices which comprises the steps of:
providing a semiconductor product which comprises at least two physically interconnected semiconductor devices having at least one scribe lane formed in at least a peripheral edge of the semiconductor product;
covering at least a portion of said scribe lane with a metal film to define a scribable area;
forming metal limiting means throughout the scribable area of the metal film;
scribing the scribable area in any direction to produce a separated semiconductor device comprising metal shards having a size within the range of about 0 to about 10 microns.

18. A method as claimed in claim 17 wherein the metal film covers the width and length of the scribable area.

* * * * *